United States Patent [19]
Goff et al.

[11] Patent Number: 5,658,123
[45] Date of Patent: Aug. 19, 1997

[54] CONTAINER-LESS TRANSFER OF SEMICONDUCTOR WAFERS THROUGH A BARRIER BETWEEN FABRICATION AREAS

[75] Inventors: Gerald L. Goff, Austin; Michael R. Conboy, Buda, both of Tex.

[73] Assignee: Advanced Micro Devices, Inc., Sunnyvale, Calif.

[21] Appl. No.: 530,404

[22] Filed: Sep. 15, 1995

[51] Int. Cl.$^6$ ................................................ B65G 65/00
[52] U.S. Cl. .......................... 414/786; 414/217; 414/404; 414/417; 414/938; 414/939
[58] Field of Search .................................. 414/217, 404, 414/417, 784, 938–940

[56] References Cited

U.S. PATENT DOCUMENTS

| | | | |
|---|---|---|---|
| 4,457,661 | 7/1984 | Flint et al. | 414/938 X |
| 4,588,343 | 5/1986 | Garrett | 414/939 X |
| 4,744,715 | 5/1988 | Kawabata | 414/938 X |
| 4,776,744 | 10/1988 | Stonestreet et al. | 414/938 X |
| 4,962,726 | 10/1990 | Matsushita et al. | 414/939 X |
| 5,110,248 | 5/1992 | Asano et al. | 414/217 X |
| 5,145,303 | 9/1992 | Clarke | 414/939 X |
| 5,193,969 | 3/1993 | Rush et al. | 414/404 |
| 5,299,901 | 4/1994 | Takayama | 414/938 X |
| 5,378,283 | 1/1995 | Ushikawa | 414/938 X |
| 5,505,577 | 4/1996 | Nishi | 414/938 X |
| 5,527,390 | 6/1996 | Ono et al. | 414/940 X |
| 5,544,421 | 8/1996 | Thompson et al. | 414/938 X |

FOREIGN PATENT DOCUMENTS

| | | | |
|---|---|---|---|
| 48442 | 2/1989 | Japan | 414/938 |
| 64232 | 3/1989 | Japan | 414/939 |
| 82618 | 3/1990 | Japan | 414/939 |
| 175179 | 7/1993 | Japan | 414/938 |

*Primary Examiner*—David A. Bucci
*Attorney, Agent, or Firm*—Kevin L. Daffer; Conley, Rose & Tayon

[57] ABSTRACT

A method and apparatus is presented for transferring semiconductor wafers through a barrier between two separate fabrication areas without the transfer of a container (i.e., wafer boat) with the wafers. The method includes providing an air lock chamber configured within a wall separating a first fabrication area and a second fabrication area. A first door providing access to the air lock chamber from the first fabrication area is opened and a first wafer boat containing the wafers is placed into the air lock chamber. The wafers are removed from the first wafer boat and placed in the air lock chamber. The empty first wafer boat is then removed from the air lock chamber, and the first door is closed. A second door providing access to the air lock chamber from the second fabrication area is opened, and an empty second wafer boat is placed into the air lock chamber. The wafers in the air lock chamber are then placed into the empty second wafer boat, and the second wafer boat containing the wafers is removed from the air lock chamber. The second door is then closed, completing the transfer of the wafers. In a preferred embodiment, the air lock chamber contains a mass transfer system which automatically performs the steps of (i) removing the wafers from the first wafer boat, and (ii) placing the wafers into the empty second wafer boat. The mass transfer system also stores the wafers inside the mass transfer system during the transfer operation.

6 Claims, 7 Drawing Sheets

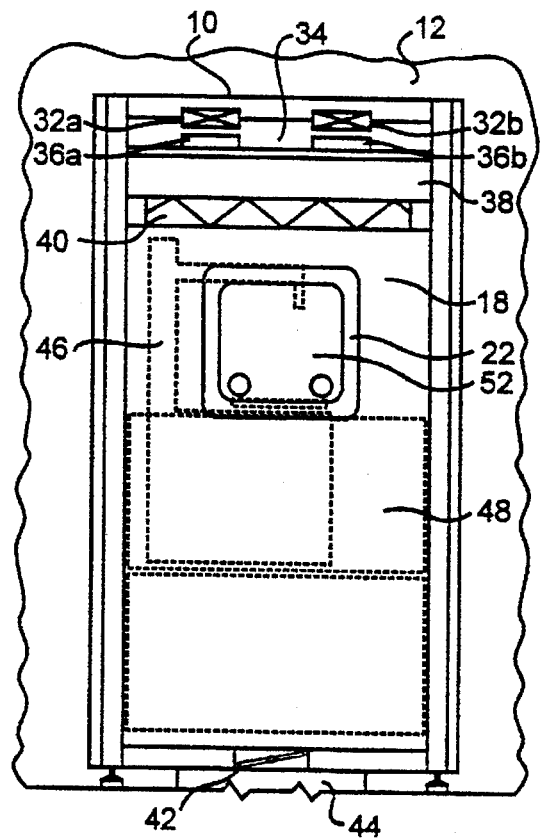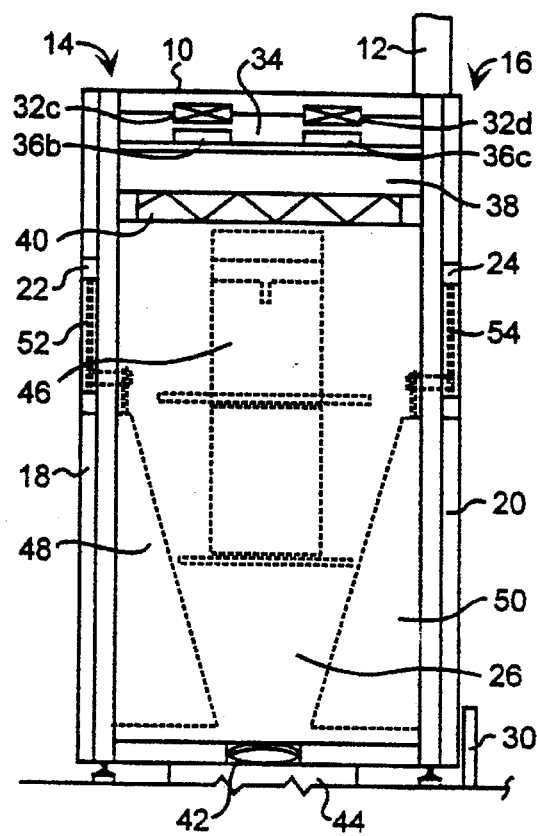
FIG. 1A          FIG. 1B
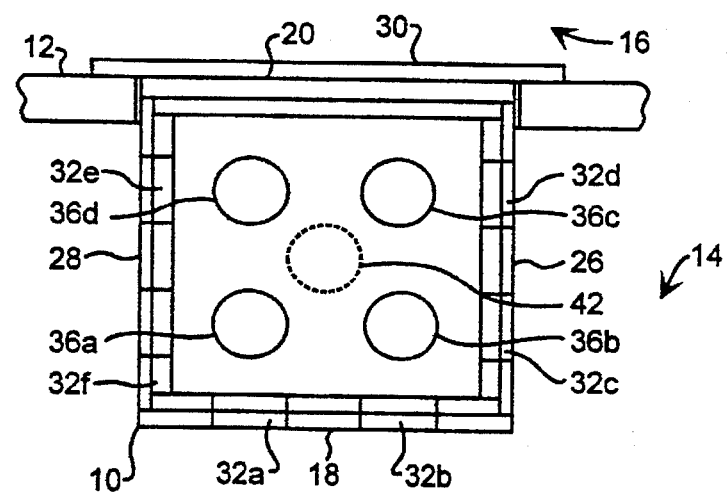
FIG. 1C

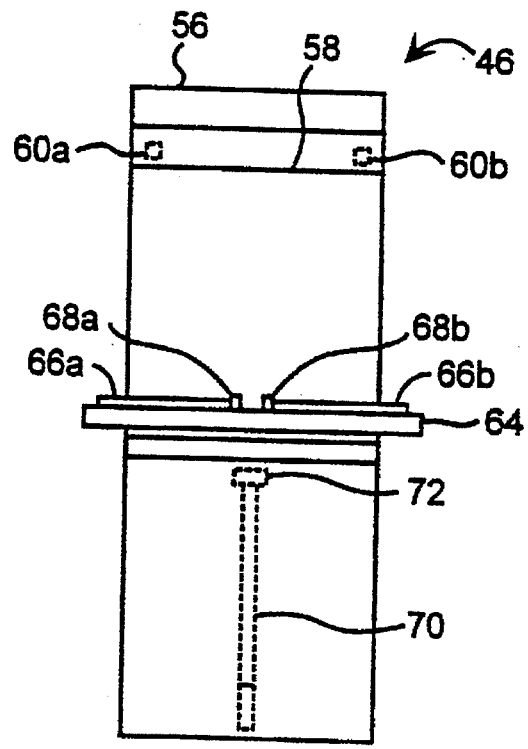
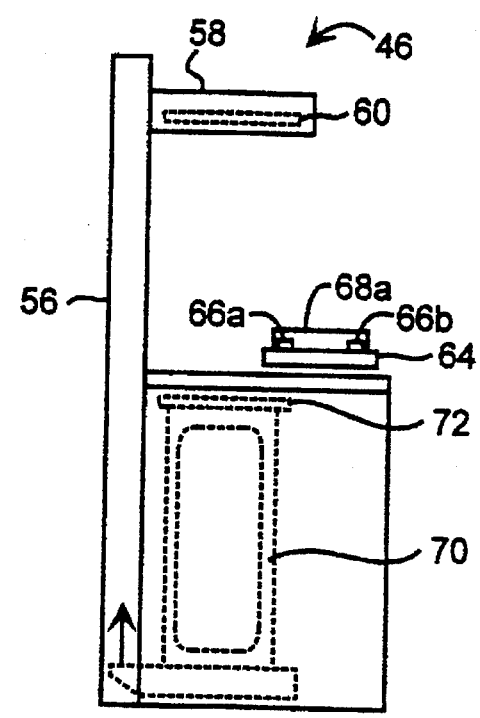
FIG. 2A  FIG. 2B
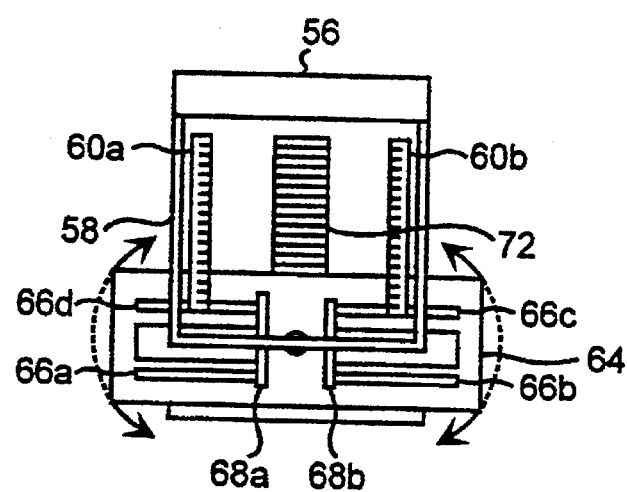
FIG. 2C

CONTAINER-LESS TRANSFER OF SEMICONDUCTOR WAFERS THROUGH A BARRIER BETWEEN FABRICATION AREAS

BACKGROUND OF THE INVENTION

1. Field of the Invention

This invention relates to integrated circuit manufacture and more particularly to a method and apparatus for transferring semiconductor wafers through a barrier between fabrication areas without transferring, through the barrier, the container which holds the wafers.

2. Description of the Relevant Art

An integrated circuit consists of electronic devices electrically coupled by conducting traces called interconnects. Interconnects are patterned from conducting layers formed on the surface of a semiconductor wafer. The ability to form stacked layers of interconnects has allowed more complex circuits to be implemented in and on relatively small surface areas of silicon substrates. The individual interconnect levels of multilevel interconnect structures are separated by layers of electrically insulating materials (i.e., interlevel dielectric layers).

As the number of interconnect levels is increased, the stacking of additional interconnect layers on top of one another tends to produce greater elevational disparity on the resulting surface topography. Problems of step coverage of a conductive layer upon the rugged topography oftentimes renders trace conductors inoperable or at least unreliable. In additional to step coverage problems, large disparity of the surface topography leads to depth of focus problems when lithography "printing" the conductive film into trace conductors. Abrupt elevational changes in the topography of a semiconductor wafer typically occur at edges of patterned layers such as interconnects. The tendency of layers formed on the surface of a semiconductor wafer to be thinner over steps is called the step coverage problem. A major factor in the processing of integrated circuits with submicron device dimensions is the very small depth of focus of the optical steppers used to pattern circuit features. In order to obtain maximum resolutions, imaging surfaces must be fairly planar with a suitable elevational disparity less than ±0.5 microns. Accordingly, interlevel dielectric planarization techniques must be employed in order to make imaging surfaces substantially planar.

Chemical mechanical polish ("CMP") is a popular interlevel dielectric used for its ability to planarize the resulting surface. CMP combines chemical etching and mechanical buffing to remove raised features on a surface of a semiconductor wafer. In a typical CMP process, a semiconductor wafer is mounted on a rotating holder and lowered onto a rotating surface flooded with a mild etchant solution, generally defined as a silica slurry. The etchant grows a thin layer on the exposed wafer surface that is almost simultaneously removed by the buffing action. The net effect is a very controlled polishing process capable of incredible flatness.

One problem with CMP techniques is that they produce large amounts of contaminants, including particulates, metallic ions, and chemical substances. The destructive effects of those contaminants is readily apparent in the overall performance of VLSI or ULSI devices. Any contaminants attributed to the slurry, chemical reactant, or buff/etch byproduct, which is thereafter introduced into other fabrication operations, severely compromises the success of that operation. For example, ingress of contaminants from the CMP operation to the thermal furnaces used for growing oxide, or to the chambers used for implanting ions, would negatively impact the outcome of the grown oxide or junction profile.

Without adequately preventing deposition of CMP-derived contaminants on semiconductor wafers undergoing other fabrication operations, CMP, as an interlevel dielectric planarization method, cannot be successfully used. One way to minimize deposition of CMP-derived contaminants on semiconductor wafers undergoing other fabrication operations (i.e., non-CMP operations) would be to perform the CMP process in an area hermetically sealed from other fabrication areas. Maintaining separate the CMP area from the other fabrication areas begins by installing a wall between those areas. Wafers must, however, be transported between the respective areas so that CMP can be incorporated within the process flow.

Transport of wafers between CMP and non-CMP areas entails passing the wafers through a door separating the areas. The door, depending upon sophistication, can be a load lock chamber adapted for receiving therethrough a wafer-containing boat. The wafer or wafers are transported in the boat through the chamber from one area to another area. The load lock comprises an air circulation and filtration system which effectively flushes the ambient air surrounding the wafers. Unfortunately, however, the load lock by itself cannot in most instances flush contaminants from the surface of boats which contain wafers. The wafer containers, or boats, pick up contaminants while in the CMP fabrication area. When the boats are passed through the load lock unit, those contaminants are not always removed from the boats. As such, the boats being passed from one area to another will maintain inappropriate contaminant count, wherein the contaminants will spread onto the wafers.

It is therefore desirable to minimize the opportunity for a contaminanted boat from passing to and from a CMP area. An effective method of preventing passage of boat-entrained contaminants into what should be a "clean room" environment from a relatively dirty CMP room is to pass only wafers, and not the boats into which they reside, between the fabrication areas. It would also be desirable to have a method of transferring semiconductor wafers between a wall separating a lower contaminant area and a higher contaminant area. To optimally restrict inappropriate movement of contaminants, the transfer must involve passage of semiconductor wafers only, and not the boats used to hold those wafers.

SUMMARY OF THE INVENTION

The problems outlined above are in large part solved by a method and apparatus for transferring semiconductor wafers through a barrier between two separate fabrication areas without the transfer of a container holding those wafers. The method includes providing an air lock chamber configured within a wall separating a first fabrication area and a second fabrication area. A first door in the air lock chamber allows access to the interior of the air lock chamber from the first fabrication area, and a second door in the air lock chamber allows access to the interior of the air lock chamber from the second fabrication area. In the transfer of one or more semiconductor wafers from the first fabrication area to the second fabrication area, the first door is opened and a first wafer boat containing the wafers is placed into the air lock chamber from the first fabrication area through the first door opening. The wafers contained within the first wafer boat are then removed from the first boat. The empty first wafer boat is then removed from the air lock chamber to the first fabrication area through the first door opening. The wafers remain in the air lock chamber. The first door is then closed. After the first door is closed, the second door is opened. An empty second wafer boat is placed into the air lock chamber from the second fabrication area through the second door opening. The wafers in the air lock chamber are then placed into the empty second wafer boat, and the second wafer boat containing the wafers is removed from the air lock chamber to the second fabrication area through the second door opening. The second door is then closed, completing the transfer of the wafers from the first fabrication area to the second fabrication area without the transfer of a wafer boat.

In a preferred embodiment, the air lock chamber contains a mass transfer system which automatically performs the steps of (i) removing the wafers from the first wafer boat, and (ii) placing the wafers into the empty second wafer boat. In removing the wafers from the first wafer boat, the mass transfer system aligns the first wafer boat underneath a spaced pair of retainer combs. As an elevator assembly and an attached elevator comb are raised, each wafer in the first wafer boat is engaged between adjacent teeth of the elevator comb at the top of the elevator assembly. The wafers are raised by the elevator assembly and elevator comb to a position between the retainer combs. The retainer combs then reciprocate inward toward the wafers, engaging each wafer between adjacent teeth of each retainer comb. Each wafer is grasped by the retainer combs at two wafer edge locations and held in place. The elevator assembly and elevator comb are then lowered to their original positions.

In placing the wafers into the empty second wafer boat, the mass transfer system aligns the empty second wafer boat underneath the pair of retainer combs holding the wafers. As an elevator assembly and an attached elevator comb are raised, each wafer held between the retainer combs is engaged between adjacent teeth of the elevator comb at the top of the elevator assembly. The retainer combs then reciprocate outward away from the wafers, releasing the wafers. The wafers are then lowered by the elevator assembly and elevator comb, and are deposited in the second wafer boat as the elevator assembly and elevator comb are lowered to their original positions.

From the time the wafers are removed from the first wafer boat until the time the wafers are placed into the empty second wafer boat, the wafers are held between the pair of retainer combs of the mass transfer system. Thus the mass transfer system also stores the wafers inside the mass transfer system during the transfer operation. In addition, a period of time is allowed to elapse between the closing of the first door and the opening of the second door during which all of the air present within the air lock chamber is exhausted and replaced. This step, involving about 30 seconds, helps prevent any airborne contaminants introduced into the air lock chamber from the first fabrication area when the first door was open from being transferred to the second fabrication area when the second door is opened.

BRIEF DESCRIPTION OF THE DRAWINGS

Other objects and advantages of the invention will become apparent upon reading the following detailed description and upon reference to the accompanying drawings in which:

FIG. 1a is an elevational view of one of two operational sides of an air lock chamber located within a wall separating a first fabrication area and a second fabrication area;

FIG. 1b is an elevational view of the air lock chamber along a plane perpendicular to the wall separating the fabrication areas, wherein the air lock chamber includes a mass transfer system contained therein;

FIG. 1c is a top (i.e., plan) view of the air lock chamber of FIG. 1a;

FIG. 2a is a front elevational view of the mass transfer system located inside the air lock chamber of FIG. 1a in a preferred embodiment;

FIG. 2b is a side elevational view of the mass transfer system of FIG. 2a;

FIG. 2c is a plan view of the mass transfer system of FIG. 2a;

Figure 3A:
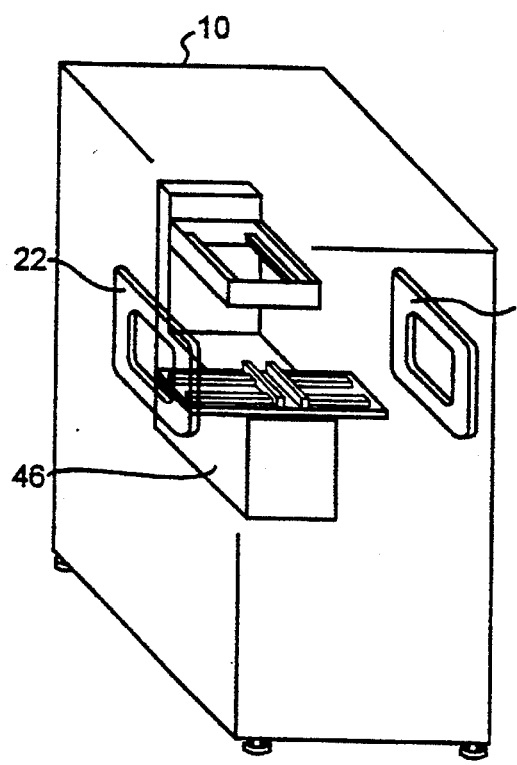
FIG. 3a is an isometric view of the air lock chamber containing the mass transfer system, the doors of the air lock chamber in the first and second fabrication areas are shown in a closed position.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

An air lock chamber provides the ability to transfer semiconductor wafers between two separate fabrication areas while providing a high level of isolation to significantly reduce the amount of contaminants introduced from one fabrication area into the other. FIG. 1a is a view of one of two operational sides of an air lock chamber 10 located in a wall 12 separating two different semiconductor wafer fabrication areas. FIG. 1b is a view of one of two blank sides of air lock chamber 10 in wall 12 between a first fabrication area 14 and a second fabrication area 16. FIG. 1c is a top view of air lock chamber 10. Air lock chamber 10 has two opposed operational sides 18 and 20 with doors 22 and 24, respectively. Operational side 18 of air lock chamber 10 is in a first fabrication area 14 on one side of wall 12, and operational side 20 of air lock chamber 10 is in a second fabrication area 16 on the other side of wall 12. Door 22 in operational side 18 allows access to the interior of air lock chamber 10 from first fabrication area 14, and door 24 in operational side 20 allows access to the interior of air lock chamber 10 from second fabrication area 16. Fabrication areas 14 and 16 may have different contamination control requirements.

In the embodiment shown if FIGS. 1a–c, three sides of air lock chamber 10 are located in first fabrication area 14, including top and bottom sides. Operational side 18, along with identical opposed blank sides 26 and 28 without doors, are located in first fabrication area 14. Operational side 20 juts through an opening within wall 12, and the exterior surface of operational side 20 is flush with the surface of wall 12 in second fabrication area 16. After air lock chamber 10 is installed in the opening within wall 12, as shown, a sealing material is used to fill the voids between sides 26 and 28 of air lock chamber 10 and wall 12. A sealing panel 30 is installed at the bottom of operational side 20, and a sealing material is used to fill the voids between sealing panel 30 and the floor of second fabrication area 16, operational side 20 of air lock chamber 10, and the surface of wall 12. Contaminants are thus prevented from traveling from one fabrication area to the other through voids around air lock chamber 10. In alternate embodiments, air lock chamber 10 may be positioned in an opening in wall 12 between two fabrication areas in any manner which allows operational side 18 of air lock chamber 10 to be located in sealed ambient communication with one fabrication area and operational side 20 to be located in sealed ambient communication with the other fabrication area.

Six air intake ports 32a–f allow air from first fabrication area 14 to enter a chamber 34 above four air supply fans 36a–d. Supply air fans 36a-d force air in chamber 34 into a plenum 38 above a high-efficiency particulate attenuation (HEPA) air filter 40. Air in plenum 38 flows through HEPA air filter 40 and downward into the interior of air lock chamber 10 in a smooth fashion and without turbulence, creating a vertical laminar flow of filtered air into air lock chamber 10. Air flows through air lock chamber 10, exits through a butterfly valve 42 in an outlet port at the bottom of air lock chamber 10, and flows into an exhaust air duct 44 under air lock chamber 10.

It is noted that in the embodiment shown, all six air intake ports 32a–f are located in first fabrication area 14. This is due to the fact that semiconductor wafer fabrication operations performed in fabrication area 14 are expected to produce fewer airborne contaminants than operations performed in fabrication area 16. Alternate embodiments may have air intake ports located in either or both fabrication areas.

The position of butterfly valve 42 controls the flow of air within air lock chamber 10 and the air pressure within air lock chamber 10. In a preferred embodiment, butterfly valve 42 is positioned to allow an airflow rate of approximately 65 cubic feet per minute through air lock chamber 10, and to maintain the air pressure within air lock chamber 10 at a level higher than the air pressures in fabrication areas 14 and 16. Maintaining the pressure within air lock chamber 10 at a level higher than the air pressures in fabrication areas 14 and 16 prevents airborne articulates in fabrication areas 14 and 16 from entering air lock chamber 10. Not able to enter air lock chamber 10, airborne particulates cannot travel from one fabrication area to the other through air lock chamber 10.

In a preferred embodiment, air lock chamber 10 contains a mass transfer system 46. Mass transfer system 46 provides an automated means of loading and unloading wafer boats configured to carry one or more semiconductor wafers. Mass transfer system 46 also provides a temporary storage location for semiconductor wafers inside air lock chamber 10. The operation of mass transfer system 46 will be described in detail below.

Doors 22 and 24 may be coupled to the associated operational side of air lock chamber 10 by hinges which allow the doors to swing open, or by two or more rails which allow the doors to first clear the door openings, then slide open along the rails. In the preferred embodiment shown, doors 22 and 24 are coupled to pneumatic door positioning mechanisms 48 and 50, respectively. When opened, doors 22 and 24 move inward just enough to clear the door openings, then are lowered by the associated door positioning mechanism into the area occupied by the door positioning mechanism. In a preferred embodiment, door 22 has a transparent window 52 made of polycarbonate glass with an antistatic coating, door 24 has a similar window 54, and door positioning mechanisms 48 and 50 have an interlock mechanism which prevents door 22 and door 24 from being open at the same time.

Seals located between door 22 and the door opening for door 22 in operational side 18, and between door 24 and the door opening for door 24 in operational side 20, prevent air from entering or leaving air lock chamber 10 through the voids between the edges of the doors and the door openings when the doors are closed. In a preferred embodiment, the seals are attached to the outer rims of doors 22 and 24 and are pneumatic. The seals are inflated with air when the doors are closed and deflated prior to the doors being opened. Air lock chamber components, including the doors and sealing mechanisms, are suitably available from the Meissner & Wurst Co., Anaheim, Calif.

FIG. 2a is a front elevational view of mass transfer system 46. FIG. 2b is a side elevational view of mass transfer system 46, and FIG. 2c is a top view of mass transfer system 46. Mass transfer system 46 includes a frame 56, an upper housing 58, two retainer combs 60a and 60b, a rotatable platform 64 with alignment rails 66a–d and stops 68a–b, and an elevator assembly 70 with an elevator comb 72. Components which may be uniquely configured to perform the present mass transfer system operation are available from the Fortrend Engineering Corporation, Sunnyvale, Calif., provided the operational details as hereinbelow specified by the co-inventors are furnished.

FIGS. 3a–c, 4a–d, 5a–c, 6a–d, and 7 will now be used to describe the operation of mass transfer system 46 and the transfer of wafers from first fabrication area 14 to second fabrication area 16 without the transfer of a wafer boat.

Figure 7:
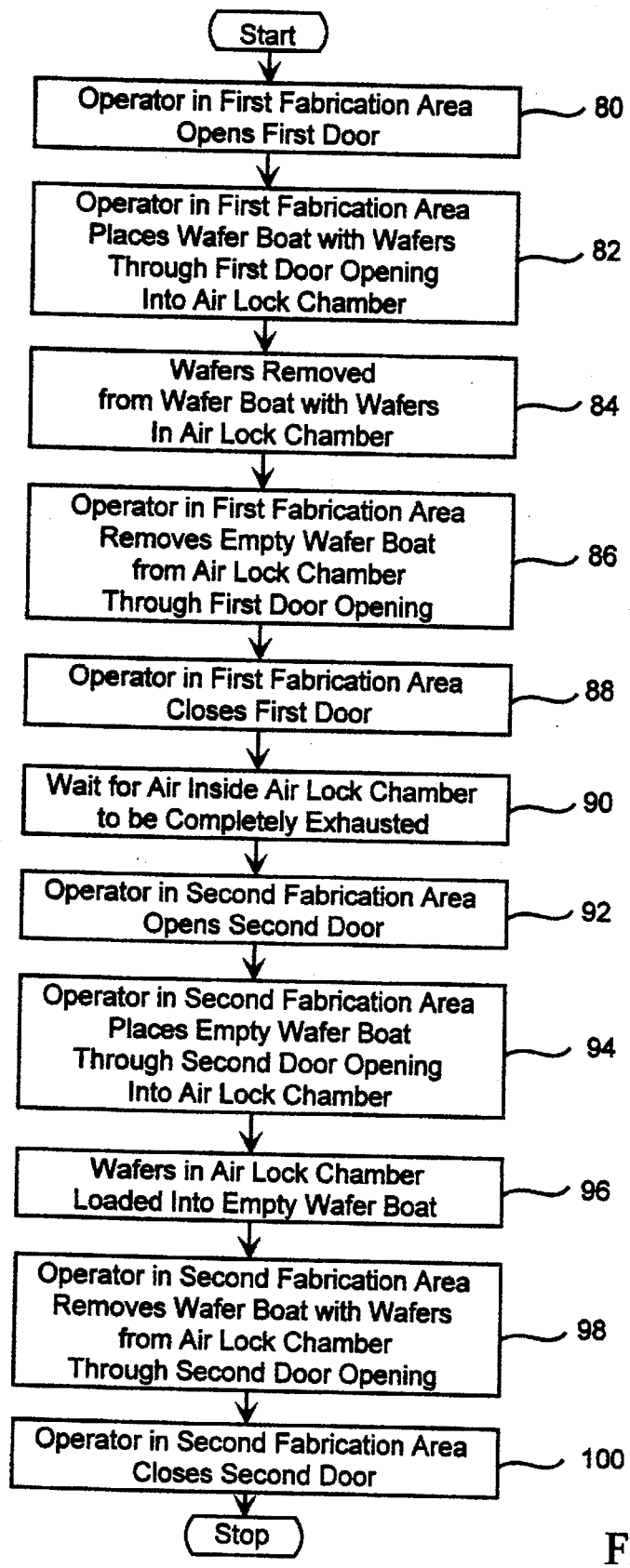
FIG. 7 is a flow chart specifying the steps in a method of transferring one or more wafers from a first fabrication area to a second fabrication area without the simultaneous transfer of a wafer boat containing the wafers.

FIG. 7 is a flow chart of the wafer transfer operation. FIG. 3a is an isometric view of air lock chamber 10 containing mass transfer system 46 with doors 22 and 24 closed.

Figure 3B:
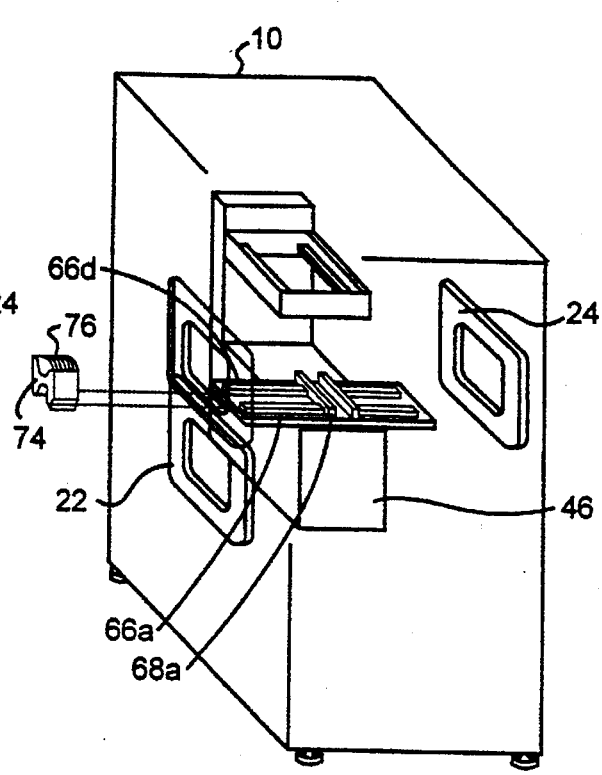
FIG. 3b is an isometric view of the air lock chamber with the door of the air lock chamber in the first fabrication area shown in an open position.

In accordance with a first step 80 in FIG. 7, a first operator in first fabrication area 14 opens door 22 in air lock chamber 10, allowing access to the interior of air lock chamber 10 from first fabrication area 14. Door 22 is preferably opened automatically by pneumatic door positioning mechanism 48 (FIGS. 1a–b) upon command of the first operator. FIG. 3b is an isometric view of air lock chamber 10 with door 22 opened. Alternately, the first operator may open a hinged door 22 by disengaging a door latch mechanism, grasping a handle coupled to door 22, and pulling or pushing the door to cause it to pivot outward or inward about a hinge until door 22 reaches an open position. If door 22 travels on two or more rails, the first operator may open door 22 by disengaging a door latch mechanism, grasping a handle coupled to door 22, and causing door 22 to move along the rails until door 22 reaches an open position.

Figure 3C:
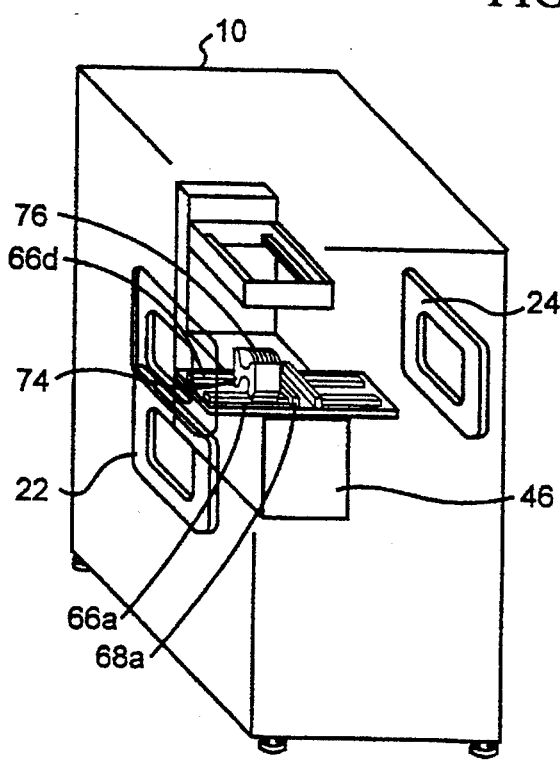
FIG. 3c is an isometric view of the air lock chamber with a first wafer boat containing wafers positioned on a rotatable platform of the mass transfer system.

In a second step 82, the first operator in first fabrication area 14 places first wafer boat 74 with wafers 76 through the door 22 opening and into air lock chamber 10. In a preferred embodiment including mass transfer system 46 as shown in FIGS. 3b–c, first wafer boat 74 with wafers 76 is placed between alignment rails 66a and 66d, and slid along the tops of alignment rails 66a and 66d until stop 68a is encountered. When stop 68a is encountered, first wafer boat 74 with wafers 76 is in a proper position for an automated wafer transfer operation performed by mass transfer system 46 as shown in FIG. 3c.

Alignment rails 66a and 66d form a first pair of alignment rails on one side of rotatable platform 64, and alignments rails 66b and 66c form a second pair of alignment rails on the other side of rotatable platform 64. Pairs of alignment rails are configured to properly align wafer boats placed on rotatable platform 64 by interfacing with the rails (or receptacles) with protrusions on the bottoms of wafer boats. Suitable wafer boats with alignment rails along the bottoms are model number KA200-80MDA-47C02 manufactured by Fluoroware, Inc., Chaska, Minn.

Figure 4A:
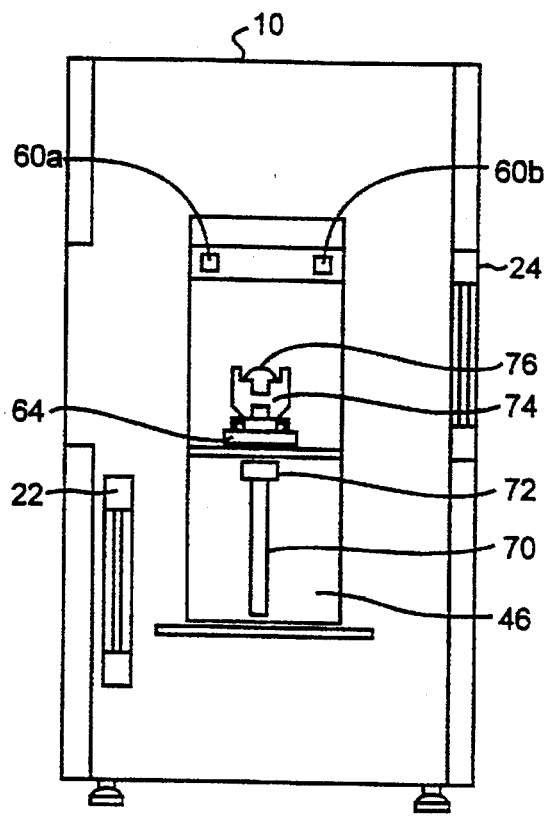
FIG. 4a is a side elevational view of the air lock chamber of FIG. 3c with the rotatable platform of the mass transfer system turned 90 degrees to position the first wafer boat containing wafers at a wafer unload/load station under a pair of retainer combs of the mass transfer system.
Figure 4B:
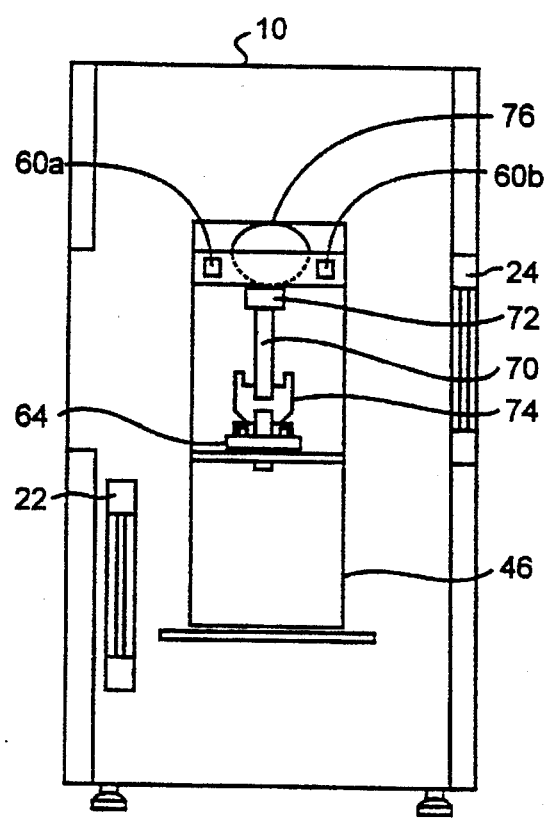
FIG. 4b is a side elevational view of the air lock chamber of FIG. 4a with an elevator assembly and an elevator comb of the mass transfer system in a raised position, the elevator comb at the top of the elevator assembly engaging each wafer in the first wafer boat between adjacent teeth of the elevator comb.
Figure 4C:
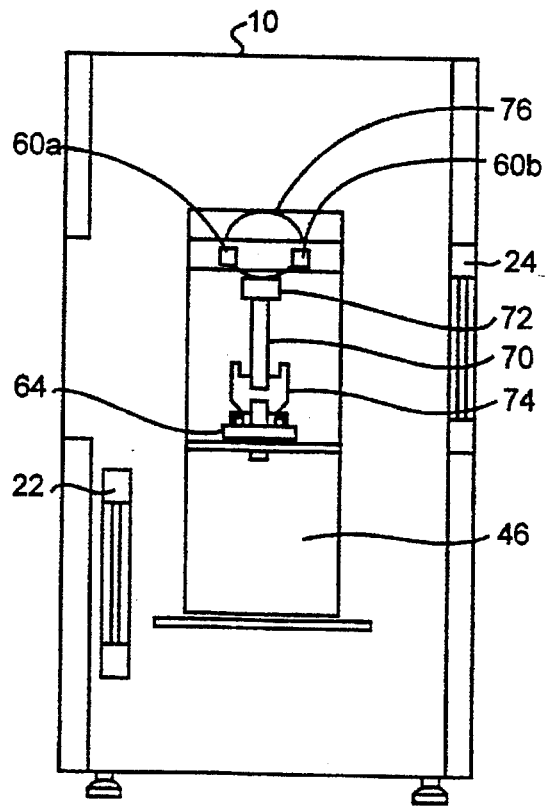
FIG. 4c is a side elevational view of the air lock chamber with the pair of retainer combs of the mass transfer system reciprocated inward toward the wafers, grasping each wafer at two wafer edge locations and holding the wafers in place.
Figure 4D:
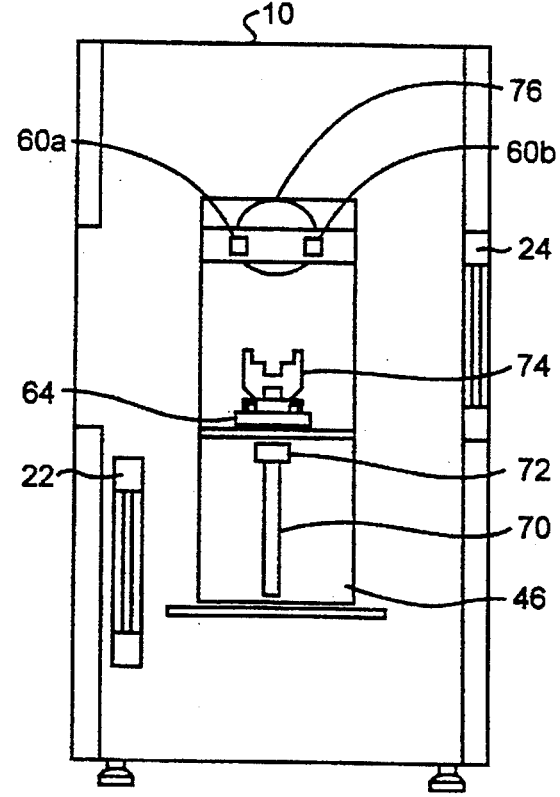
FIG. 4d is a side elevational view of the air lock chamber with the elevator assembly and elevator comb lowered to their original positions, the wafers shown held in the retainer combs of the mass transfer system.

In a third step 84, wafers 76 are removed from first wafer boat 74. Wafers 76 removed from first wafer boat 74 remain within air lock chamber 10. FIGS. 4a–d show mass transfer system 46 accomplishing step 84 automatically upon command of the first operator in first fabrication area 14. As shown in FIG. 4a, rotatable platform 64 is first rotated 90 degrees to position first wafer boat 74 with wafers 76 at a wafer unload/load station under retainer combs 60a–b of mass transfer system 46. Elevator assembly 70 is then raised, engaging each wafer in first wafer boat 74 between adjacent teeth of elevator comb 72 at the top of elevator assembly 70 as shown in FIG. 4b. The teeth of elevator comb 72 maintain the relative positions of wafers 76 while they are lifted out of first wafer boat 74. Wafers 76 in elevator comb 72 are lifted by elevator assembly 70 until wafers 76 are in a proper position between retainer combs 60a–b. As shown in FIG. 4c, retainer combs 60a–b then reciprocate inward toward wafers 76, engaging each wafer between adjacent teeth of each retainer comb. Wafers 76 are thus grasped by retainer combs 60a–b at two wafer edge locations and held in place. Elevator assembly 70 and elevator comb 72 are then lowered into their original positions as shown in FIG. 4d. Retainer combs 60a–b now constitute a temporary storage location for wafers 76 within air lock chamber 10.

In alternate embodiments, third step 84 may be performed by other types of mass transfer systems automatically upon command of the first operator in first fabrication area 14. Third step 84 may also be performed manually by the first operator in first fabrication area 14, wherein the first operator removes wafers 76 from first wafer boat 74 and places them inside air lock chamber 10. Wafers 76 removed from first wafer boat 74 may be placed in a storage location within air lock chamber 10 configured to hold one or more semiconductor wafers.

In a step 86, the first operator in first fabrication area 14 removes empty first wafer boat from air lock chamber 10 into first fabrication area 14 through the door 22 opening. In a preferred embodiment, rotatable platform 64 of mass transfer system 46 is first rotated 90 degrees to position empty first wafer boat 74 in its original position in front of door 22. The first operator in first fabrication area then removes empty first wafer boat 74 from air lock chamber 10 into first fabrication area 14 through the door 22 opening.

Figure 5A:
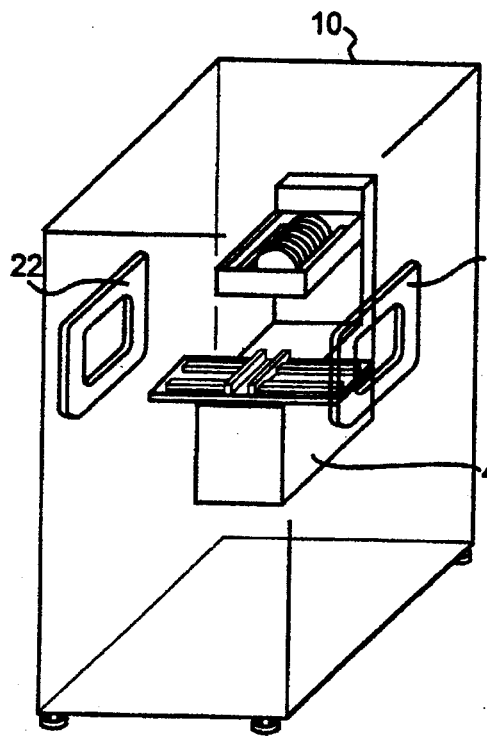
FIG. 5a is an isometric view of the air lock chamber with the doors to the first and second fabrication areas in a closed position, the wafers shown held in the retainer combs of the mass transfer system.

In a step 88, the first operator in first fabrication area 14 closes door 22. Door 22 is preferably closed automatically by pneumatic door positioning mechanism 48 (FIGS. 1a–b) upon command of the first operator. FIG. 5a is an isometric view of air lock chamber 10 with both doors 22 and 24 closed, and wafers 76 held in retainer combs 60a–b of mass transfer system 46. Alternately, the first operator may close a hinged door 22 by grasping a handle coupled to door 22, pulling or pushing the door to cause it to pivot outward or inward about a hinge until door 22 reaches a closed position, and engaging a door latch mechanism. If door 22 travels on two or more rails, the first operator may close door 22 by grasping a handle coupled to door 22, causing door 22 to move along the rails until door 22 reaches a closed position, and engaging a door latch mechanism.

In a step 90, a period of time is allowed to elapse within which all of the air present within air lock 10 when door 22 was open is exhausted and replaced by filtered air provided by supply air fans 36a–d. In the preferred embodiment, this amount of time is about 30 seconds. This step helps prevent any airborne contaminants introduced into air lock chamber 10 from first fabrication area 14 when door 22 is open from being transferred to second fabrication area 16 when door 24 is opened.

Figure 5B:
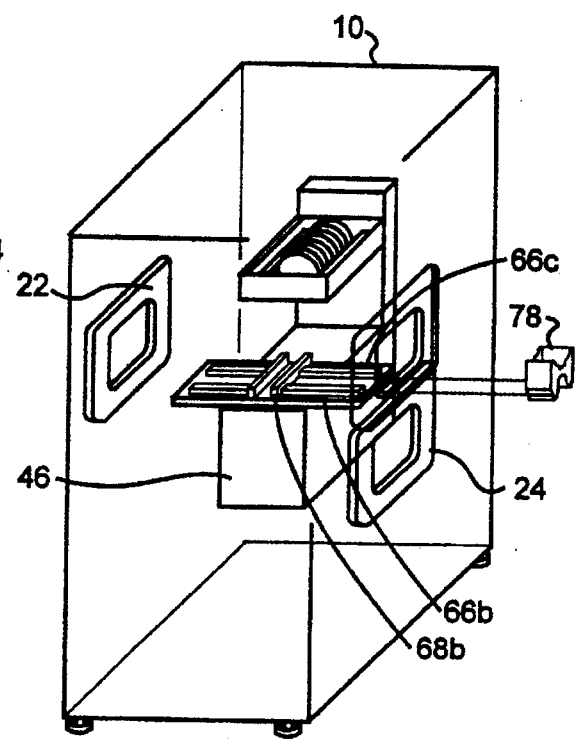
FIG. 5b is an isometric view of the air lock chamber with the door to the second fabrication area in an open position.

In a step 92, a second operator in second fabrication area 16 opens door 24, allowing access to the interior of air lock chamber 10 from second fabrication area 16. Door 24 is preferably opened automatically by pneumatic door positioning mechanism 50 (FIG. 1b) upon command of the second operator. FIG. 5b is an isometric view of air lock chamber 10 with door 24 opened and wafers 76 held in retainer combs 60a–b of mass transfer system 46. Alternately, the second operator may open a hinged door 24 by disengaging a door latch mechanism, grasping a handle coupled to door 24, and pulling or pushing the door to cause it to pivot outward or inward about a hinge until door 24 reaches an open position. If door 24 travels on two or more rails, the second operator may open door 24 by disengaging a door latch mechanism, grasping a handle coupled to door 24, and causing door 24 to move along the rails until door 24 reaches an open position.

Figure 5C:
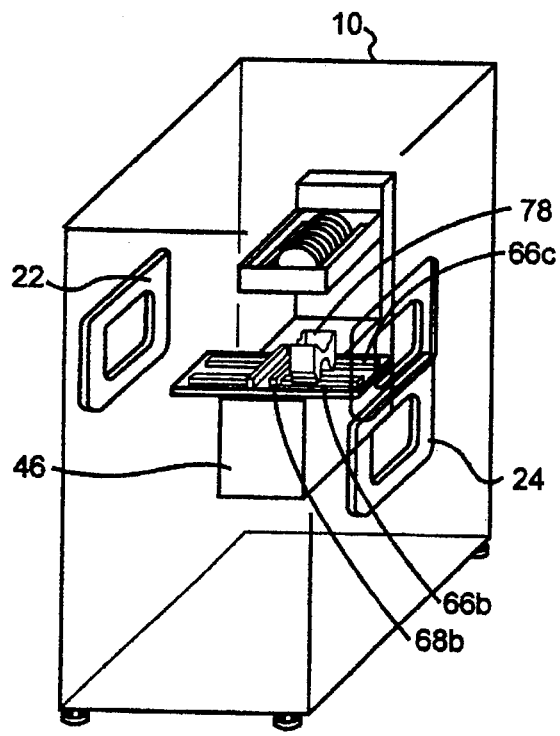
FIG. 5c is an isometric view of the air lock chamber with an empty second wafer boat positioned on the rotatable platform of the mass transfer system.

In a step 94, the second operator in second fabrication area 16 places an empty second wafer boat 78 through the door 24 opening and into air lock chamber 10. In a preferred embodiment including mass transfer system 46 as shown in FIGS. 5b–c, empty second wafer boat 78 is placed between alignment rails 66b and 66c, and slid along the tops of alignment rails 66b and 66c until stop 68b is encountered. When stop 68b is encountered, second wafer boat 78 is in a proper position for an automated wafer transfer operation performed by mass transfer system 46 as shown in FIG. 5c.

Figures 6A, 6B:
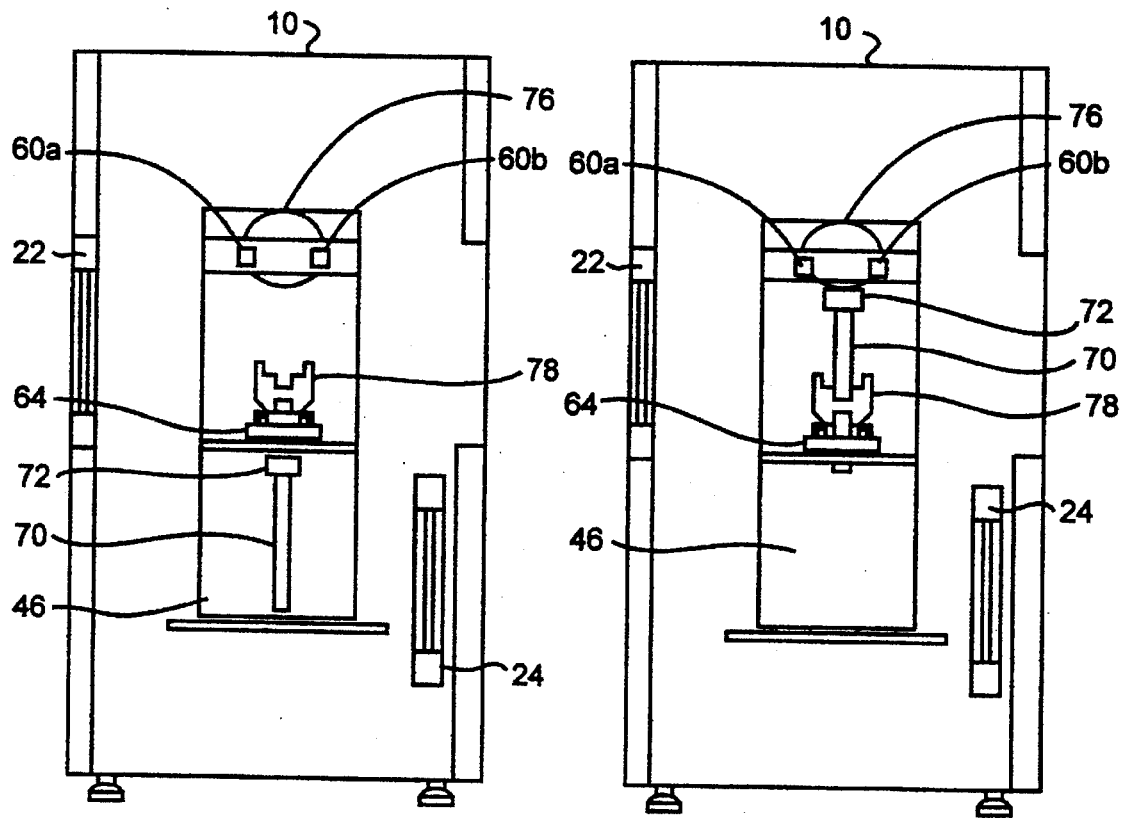
FIG. 6a is a side elevational view of the air lock chamber with the rotatable platform of the mass transfer system turned 90 degrees to position the empty second wafer boat at the wafer unload/load station under the wafers held in the pair of retainer combs of the mass transfer system.
FIG. 6b is a side elevational view of the air lock chamber with the elevator assembly and elevator comb of the mass transfer system in the raised position, the elevator comb engaging each wafer held in the retainer combs between adjacent teeth of the elevator comb as the elevator assembly and elevator comb were raised.
Figures 6C, 6D:
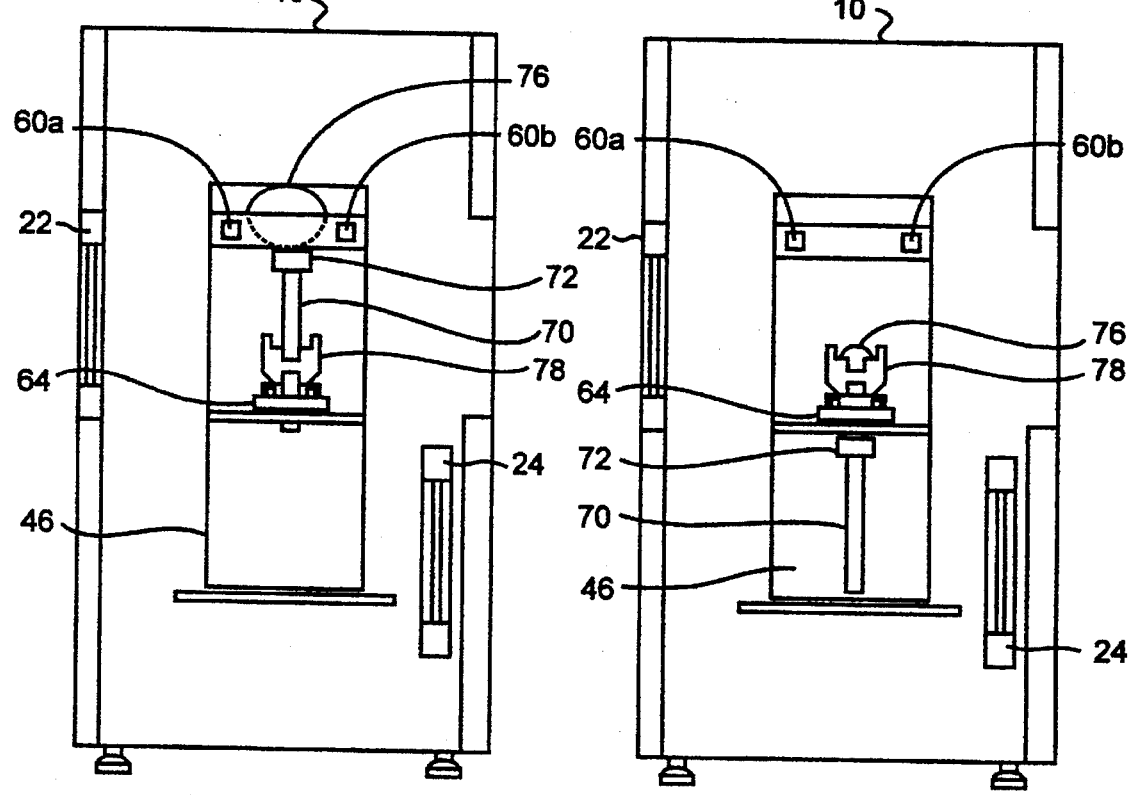
FIG. 6c is a side elevational view of the air lock chamber of FIG. 6b with the pair of retainer combs reciprocated outward away from the wafers, the pair of retainer combs thus releasing the wafers.
FIG. 6d is a side elevational view of the air lock chamber with the wafers deposited in the empty second wafer boat as the elevator assembly and the elevator comb are lowered to their original positions.

In a step 96, wafers 76 in air lock chamber 10 are loaded into empty second wafer boat 78. In a preferred embodiment, mass transfer system 46 accomplishes step 96 automatically upon command of the second operator in second fabrication area 16 as shown in FIGS. 6a–d. As shown in FIG. 6a, rotatable platform 64 is first rotated 90 degrees to position empty second wafer boat 78 at the wafer unload/load station under retainer combs 60a–b of mass transfer system 46. Elevator assembly 70 is then raised, engaging each wafer held in retainer combs 60a–b between adjacent teeth of elevator comb 72 at the top of elevator assembly 70 as shown in FIG. 6b. The teeth of elevator comb 72 maintain the relative positions of wafers 76 while they are lowered into empty second wafer boat 78. As shown in FIG. 6c, retainer combs 60a–b then reciprocate outward and away from wafers 76, releasing wafers 76. Wafers 76 are then lowered by elevator assembly 70 into empty second wafer boat 78 as shown in FIG. 6d. Wafers 76 are now contained in second wafer boat 78.

In alternate embodiments, step 96 may be performed by other types of mass transfer systems automatically upon command of the second operator. Step 96 may also be performed manually by the second operator, wherein the second operator removes wafers 76 from inside air lock chamber 10 and places them in second wafer boat 78.

In a step 98, the second operator in second fabrication area 16 removes wafer boat 78 containing wafers 76 from air lock chamber 10 through the door 24 opening. In a preferred embodiment, rotatable platform 64 of mass transfer system 46 is first rotated 90 degrees to position wafer boat 78 containing wafers 76 in its original position in front of door 24. The second operator in second fabrication area 16 then removes wafer boat 78 containing wafers 76 from air lock chamber 10 through the door 24 opening.

In final step 100, the second operator in second fabrication area 16 closes door 24. Door 24 is preferably closed automatically by pneumatic door positioning mechanism 50 (FIG. 1b) upon command of the second operator. Alternately, the second operator may close a hinged door 24 by grasping a handle coupled to door 24, pulling or pushing the door to cause it to pivot outward or inward about a hinge until door 24 reaches a closed position, and engaging a door latch mechanism. If door 24 travels on two or more rails, the second operator may close door 24 by grasping a handle coupled to door 24, causing door 24 to move along the rails until door 24 reaches a closed position, and engaging a door latch mechanism.

In a preferred embodiment, doors 22 and 24 are opened and closed automatically by pneumatic door positioning mechanisms 48 and 50, respectively, upon command of an operator. Said command may be the activation of an electrical switch which causes electrical and mechanical action resulting in proper positioning of the doors.

After completion of steps 80–100, wafers 76 have been transferred from first fabrication area 14 to second fabrication area 16 without the transfer of a wafer boat. Wafer boats remain in their respective fabrication areas to minimize the transfer of any particulate contaminants which may be on the exterior surfaces of the wafer boats.

It will be appreciated to those skilled in the art having the benefit of this disclosure that this invention is believed to be capable of transferring semiconductor wafers from a first fabrication area to a second fabrication area without having to transfer a wafer boat containing the wafers of varying sizes from the first fabrication area to the second fabrication area. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method for transferring a semiconductor wafer through a transfer system situated between a first fabrication area and a second fabrication area, comprising the steps of:

providing an air lock chamber configured within a wall separating said first and second fabrication areas;

opening a first door at one side of said air lock chamber and inserting a wafer-containing first wafer boat into the air lock chamber from the first fabrication area;

separating a wafer contained with the first wafer boat from the first wafer boat and thereafter extracting the first wafer boat from the air lock chamber through the first door and into the first fabrication area;

closing the first door and thereafter opening a second door configured at a side of the air lock chamber opposite the first door; and moving the wafer from the air lock chamber through the second door and into the second fabrication area.

2. The method as recited in claim 1, wherein said separating step comprises:

aligning the wafer-containing first wafer boat underneath a spaced pair of retainer combs;

elevating the wafer contained within the first wafer boat to a position between the retainer combs such that the wafer is aligned between adjacent teeth of each of the pair of retainer combs; and reciprocating the retainer combs inward toward the wafer to grasp the wafer at two wafer edge locations.

3. The method as recited in claim 1, wherein said closing step comprises purging ambient from the air lock chamber after the first door is closed and before the second door is opened.

4. The method as recited in claim 1, wherein said first door separates said first fabrication area from said air lock chamber.

5. The method as recited in claim 1, wherein said second door separates said second fabrication area from said air lock chamber.

6. The method as recited in claim 1, wherein said moving step comprises:

inserting a second wafer boat from the second fabrication area into the air lock chamber; and placing the wafer into the second wafer boat and thereafter extracting the resulting wafer-containing second wafer boat from the air lock chamber.

* * * * *